United States Patent
Sekisawa et al.

(10) Patent No.: US 9,728,566 B2
(45) Date of Patent: Aug. 8, 2017

(54) SOLID STATE IMAGING DEVICE AND MANUFACTURING METHOD THEREOF

(71) Applicant: SEIKO EPSON CORPORATION, Tokyo (JP)

(72) Inventors: Mitsuo Sekisawa, Sakata (JP); Kazunobu Kuwazawa, Sakata (JP); Noriyuki Nakamura, Sakata (JP); Takehiro Endo, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/202,172

(22) Filed: Jul. 5, 2016

(65) Prior Publication Data
US 2017/0025452 A1  Jan. 26, 2017

(30) Foreign Application Priority Data
Jul. 22, 2015  (JP) .................. 2015-145271

(51) Int. Cl.
*H01L 27/146*  (2006.01)

(52) U.S. Cl.
CPC .... *H01L 27/1461* (2013.01); *H01L 27/14643* (2013.01); *H01L 27/14689* (2013.01)

(58) Field of Classification Search
CPC .............................................. H01L 27/14643
See application file for complete search history.

(56) References Cited

U.S. PATENT DOCUMENTS

| 7,105,793 | B2 * | 9/2006 | Rhodes ............. H01L 27/14627 250/208.1 |
| 8,169,523 | B2 * | 5/2012 | Itonaga ............. H01L 27/14603 257/291 |
| 8,482,642 | B2 | 7/2013 | Rysinski |
| 8,957,357 | B2 * | 2/2015 | Itonaga ............. H01L 27/14609 250/208.1 |
| 2008/0142856 | A1 * | 6/2008 | Sato .................. H01L 27/14609 257/292 |
| 2008/0157138 | A1 * | 7/2008 | Lee ................... H01L 27/14603 257/292 |
| 2008/0157147 | A1 * | 7/2008 | Lim .................. H01L 27/14609 257/292 |

(Continued)

FOREIGN PATENT DOCUMENTS

| JP | H05-121459 A | 5/1993 |
| JP | 2010-219563 A | 9/2010 |
| JP | 2010-239075 A | 10/2010 |

*Primary Examiner* — Thao P Le
(74) *Attorney, Agent, or Firm* — Oliff PLC

(57) ABSTRACT

A solid state imaging device according to the invention includes: a semiconductor layer of a first conductivity type; a gate insulation film that is located on the semiconductor layer; a gate electrode that is located on the gate insulation film; a first impurity region of a second conductivity type that is located at least in a region outside the gate electrode on a first end portion side; a second impurity region of the second conductivity type that is located in a region extending across a second end portion that is opposite to the first end portion of the gate electrode; and a third impurity region of the first conductivity type that is located on top of the second impurity region at a position outside the gate electrode on the second end portion side, and is in contact with the second impurity region.

8 Claims, 14 Drawing Sheets

(56) References Cited

U.S. PATENT DOCUMENTS

2011/0049589 A1* 3/2011 Chuang ............ H01L 27/14609
257/292
2012/0044396 A1 2/2012 Rysinski \* cited by examiner

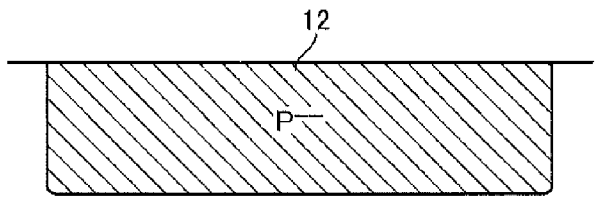
FIG. 5A
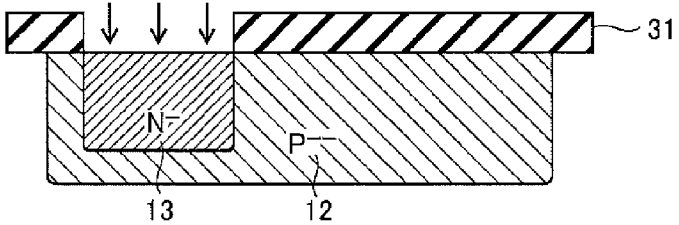
FIG. 5B
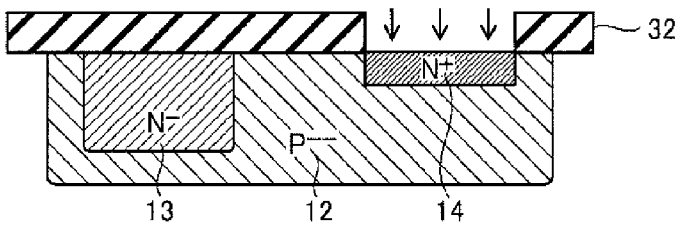
FIG. 5C
FIG. 5D
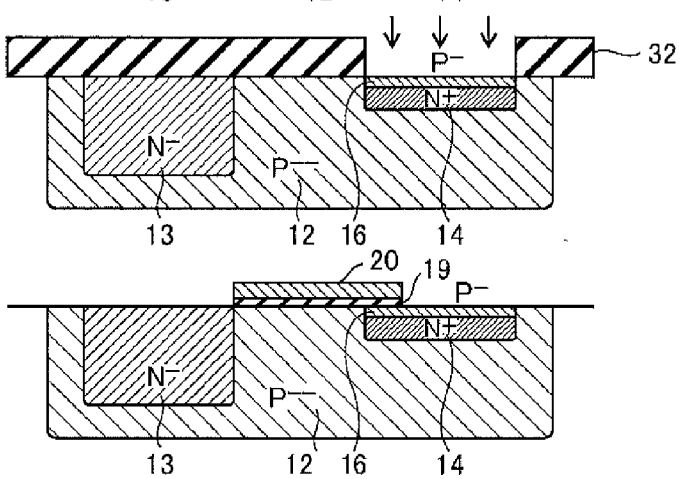
FIG. 5E
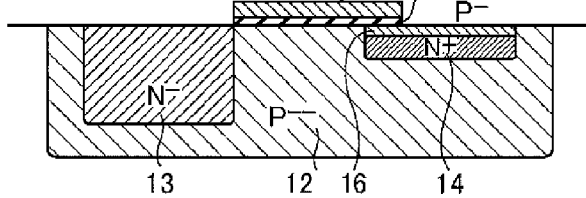
FIG. 5F
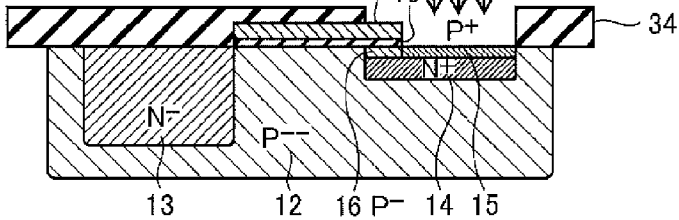
FIG. 5G
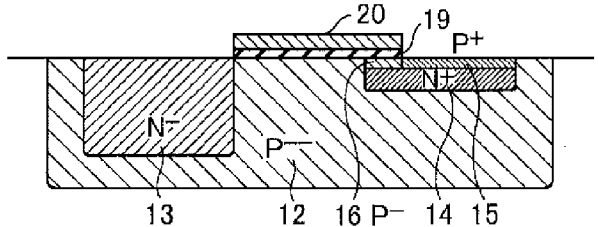

SOLID STATE IMAGING DEVICE AND MANUFACTURING METHOD THEREOF

BACKGROUND

1. Technical Field

The present invention relates to a solid state imaging device and a manufacturing method thereof.

2. Related Art

Conventionally, CCDs have been used as a major solid state imaging device, but significant development has been made on CMOS sensors which can be driven at a low voltage and peripheral circuits can be mounted thereon. As a result of taking measures during manufacturing process such as a complete transfer technique and a dark current prevention structure and measures against noise in circuits such as CDS (correlated double sampling), CMOS sensors have been improved and grown as a device surpassing that of CCDs in terms of both quality and quantity, and are now recognized as having image quality equal to that of CODs. Such a significant advancement of CMOS sensors was made possible by a significant improvement in image quality, and an improvement in charge transfer technique was one of improvement factors.

As a related technique, JP-A-5-121459 (paragraphs [0009] to [0012], and FIGS. 1 and 2) discloses a solid state imaging apparatus including a FD (floating diffusion) amplifier that does not generate reset noise. The solid state imaging apparatus includes a FD amplifier type charge detection portion including a diffusion region of a second conductivity type formed on a semiconductor layer of a first conductivity type, a potential barrier forming gate electrode provided adjacent to the diffusion region, a final gate electrode of a charge transfer apparatus provided adjacent to the potential barrier forming gate electrode, a resetting MOS transistor for resetting the diffusion region including the diffusion region formed as a source electrode, and a source follower circuit for detecting the potential of the diffusion region, wherein the diffusion region is formed so as to have a high impurity concentration at a center portion thereof and a low impurity concentration at end portions, and a diffusion region of the first conductivity type is formed on the center portion of the diffusion region.

According to JP-A-5-121459 (paragraphs [0009] to [0012], and FIGS. 1 and 2), a diffusion layer of the first conductivity type having a high concentration is formed on the diffusion region of the second conductivity type that forms a floating diffusion. Accordingly, if the resetting transistor is turned on, the diffusion layer is completely depleted, and signal charges transferred from an image capturing portion flow into the floating diffusion and are completely transferred to the drain of the resetting transistor. If the resetting transistor is turned off, because the potential is in a floating state, potential variations at the time of reset operation does not occur, and thus reset noise is not generated.

However, when the diffusion layer (pinning layer) of the first conductivity type having a high concentration is formed on the diffusion region of the second conductivity type to which signal charges are transferred from a photodiode of the image capturing portion, a potential barrier may be formed in the transfer path for transferring signal charges from the photodiode, or the signal charges transferred to an impurity region, which is a transfer destination, may flow backward, causing a problem of poor transfer.

SUMMARY

An advantage of some aspects of the invention provides a solid state imaging apparatus that can reduce dark current generated by residual charges in an impurity region to which signal charges are transferred from a photodiode and suppress the generation of a potential barrier in a transfer path for transferring the signal charges.

Also, an advantage of some aspects of the invention provides a solid state imaging apparatus that can suppress a backflow of signal charges transferred from a photodiode to an impurity region which is a transfer destination.

A solid state imaging device according to a first aspect of the invention includes: a semiconductor layer of a first conductivity type; a gate insulation film that is located on the semiconductor layer; a gate electrode that is located on the gate insulation film; a first impurity region of a second conductivity type that is located in the semiconductor layer and is located, as viewed in plan view, at least in a region outside the gate electrode on a first end portion side; a second impurity region of the second conductivity type that is located in the semiconductor layer and is located, as viewed in plan view, in a region extending across a second end portion that is opposite to the first end portion of the gate electrode; and a third impurity region of the first conductivity type that is located in the semiconductor layer, is located on top of the second impurity region at a position outside the gate electrode on the second end portion side as viewed in plan view, and is in contact with the second impurity region.

According to the first aspect of the invention, by providing the third impurity region on top of the second impurity region to which signal charges are transferred from the first impurity region constituting a photodiode, it is possible to reduce dark current generated by residual charges in the second impurity region. In addition, by providing the second impurity region also in the semiconductor layer at a position under the gate electrode on the second end portion side as viewed in plan view, it is possible to suppress the generation of a potential barrier in the transfer path for transferring signal charges and implement transfer with less residual charges.

Here, the solid state imaging device may further include a fourth impurity region of the first conductivity type that is located in the semiconductor layer, is located at a position between the second impurity region and the gate insulation film, is in contact with the second impurity region and the gate insulation film, and has an impurity concentration lower than an impurity concentration of the third impurity region. The fourth impurity region functions to suppress the generation of a potential well, and thus, the size and impurity concentration of each constituent element can be adjusted so as to not generate a potential barrier or well in the transfer path for transferring signal charges.

Also, the solid state imaging device may further include a fifth impurity region of the second conductivity type that is located in the semiconductor layer, extends from a portion under the gate insulation film to a portion under the second impurity region, is in contact with the gate insulation film and the second impurity region, and has an impurity concentration lower than an impurity concentration of the second impurity region. With this configuration, almost no potential barrier or well is generated, and thus a transfer path for transferring signal charges having a smooth profile is implemented. Also, because the fifth impurity region has been added, in the transfer path for transferring signal charges, the distance from the first impurity region to an initial potential step is shortened. Accordingly, when the transfer gate is turned off, the potential step functions to block the charges, and thus an effect of preventing the backflow of signal charges transferred to the second impurity region can be obtained.

In the solid state imaging device described above, it is desirable that the second impurity region has an overlapping length that overlaps the gate electrode as viewed in plan view of greater than 0 and less than or equal to ⅓ of a length of the gate electrode. With this configuration, it is possible to suppress the generation of a potential barrier in the transfer path for transferring signal charges while not so much reducing the output voltage of the solid state imaging device, and to reduce the residual image voltage.

A method of manufacturing a solid state imaging device according to a second aspect of the invention includes: (a) implanting impurity ions of a second conductivity type into a semiconductor layer of a first conductivity type by using a first photoresist as a mask so as to form a first impurity region of the second conductivity type in the semiconductor layer; (b) implanting impurity ions of the second conductivity type into the semiconductor layer by using a second photoresist as a mask so as to form a second impurity region of the second conductivity type in the semiconductor layer; (c) forming a gate electrode on the semiconductor layer via a gate insulation film, the gate electrode having an overlapping portion that overlaps the second impurity region as viewed in plan view; and (d) implanting impurity ions of the first conductivity type into the semiconductor layer by using the gate electrode and a third photoresist as a mask so as to form a third impurity region of the first conductivity type in the semiconductor layer, the third impurity region being located on top of the second impurity region and being in contact with the second impurity region.

According to the second embodiment of the invention, the third impurity region is formed by using the gate electrode and the third photoresist as a mask after the gate electrode having an overlapping portion that overlaps the impurity region as viewed in plan view has been formed, and thus the second impurity region can be caused to extend to a portion under the gate electrode, and the third impurity region can be accurately positioned with respect to the gate electrode. Accordingly, the potential in the transfer path for transferring signal charges can be easily controlled.

Here, the method of manufacturing a solid state imaging device may further include (e) prior to the step (c), implanting impurity ions of the first conductivity type into the second impurity region by using the second photoresist as a mask so as to form, in the semiconductor layer, a fourth impurity region of the first conductivity type that is in contact with the second impurity region and has an impurity concentration lower than an impurity concentration of the third impurity region. With this configuration, the second impurity region and the fourth impurity region can be formed in a self-alignment manner by using the same mask. Accordingly, the potential in the transfer path for transferring signal charges can be easily controlled.

Also, the method of manufacturing a solid state imaging device may further include (f) prior to the step (c), implanting impurity ions of the second conductivity type into the semiconductor layer by using a fourth photoresist as a mask so as to form, in the semiconductor layer, a fifth impurity region of the second conductivity type that extends from a surface of the semiconductor layer to a portion under the second impurity region, is in contact with the second impurity region, and has an impurity concentration lower than an impurity concentration of the second impurity region. By using a mask that is different from the mask used to form the second impurity region, the fifth impurity region can be formed to have a wider area than the second impurity region. Accordingly, the potential in the transfer path for transferring signal charges can be easily controlled.

In the specification of the present application, the semiconductor layer refers to a semiconductor substrate, a well formed in a semiconductor substrate, or an epitaxial layer formed on a semiconductor substrate. The first conductivity type may be P-type, and the second conductivity type may be N-type. Alternatively, the first conductivity type may be N-type, and the second conductivity type may be P-type.

BRIEF DESCRIPTION OF THE DRAWINGS

The invention will be described with reference to the accompanying drawings, wherein like numbers reference like elements.

FIGS. 5A to 5G are diagrams illustrating the steps of a method of manufacturing the solid state imaging device shown in FIGS. 4A to 4C.

DESCRIPTION OF EXEMPLARY EMBODIMENTS

Figure 1A:
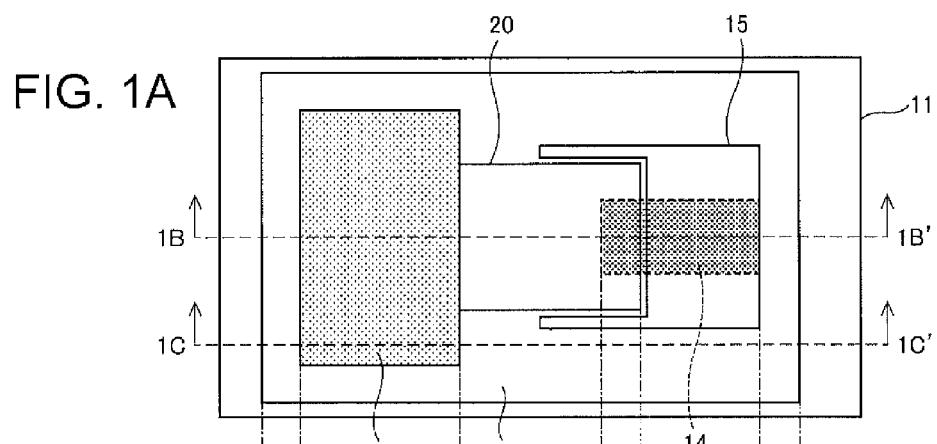
FIGS. 1A to 1C are diagrams showing a solid state imaging device according to a first embodiment of the invention.

Hereinafter, embodiments of the invention will be described in detail with reference to the drawings. The same constituent elements are given the same reference numerals, and a redundant description is omitted. The following embodiments will be described by using solid state imaging devices that are driven at a low voltage. As the semiconductor substrates on which the solid state imaging devices are formed, it is possible to use N-type semiconductor substrates or P-type semiconductor substrates. However, the following description will be given taking, as an example, cases where an N-type silicon substrate is used.

First Embodiment

Figure 1B:
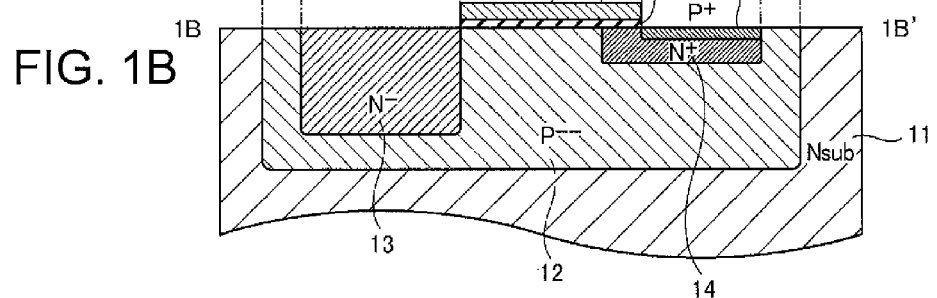
Figure 1C:
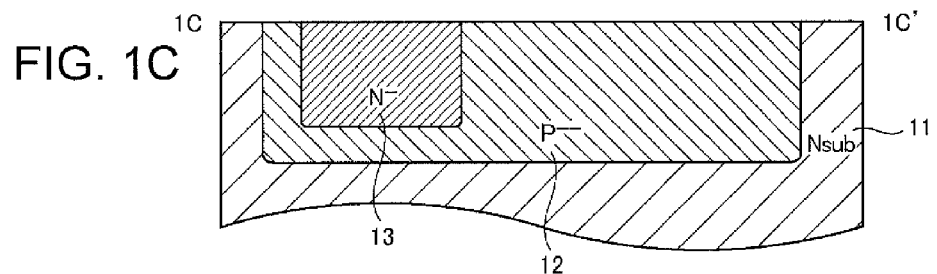

FIGS. 1A to 1C are diagrams showing a solid state imaging device according to a first embodiment of the invention. FIG. 1A is a plan view, FIG. 1B is a cross-sectional view taken along the line 1B-1B' shown in FIG. 1A, and FIG. 1C is a cross-sectional view taken along the line 1C-1C' shown in FIG. 1A.

The solid state imaging device includes a P well (P$^{--}$) 12 formed in an N-type silicon substrate (Nsub) 11, an N-type impurity region (N$^-$) 13, an N-type impurity region (N$^+$) 14 and a P-type impurity region (P$^+$) 15 that are formed in the P well 12, a gate insulation film 19 located on the P well 12, and a gate electrode (transfer gate electrode) 20 located on the gate insulation film 19.

The N-type impurity region (N$^-$) 13, which is a first impurity region, is located in the P well 12. As viewed in plan view, the N-type impurity region 13 is located at least in a region outside the gate electrode 20 on a first end portion side (the end portion on the left side of the diagram), and constitutes an N-type impurity region of a photodiode. The N-type impurity region 13 may be located in a region extending across the first end portion of the gate electrode 20 as viewed in plan view. The expression "as viewed in plan view" as used herein refers to viewing the constituent elements from a direction vertical to a main surface (upper surface in FIG. 1B) of the N-type silicon substrate 11.

The N-type impurity region (N$^+$) 14, which is a second impurity region, is located in the P well 12. As viewed in plan view, the N-type impurity region 14 is located in a region extending across a second end portion (the end portion on the right side of the diagram) that is opposite to the first end portion of the gate electrode 20. The N-type impurity region 14 is used as an impurity region for storing charges transferred from the photodiode.

The P-type impurity region (P$^+$) 15, which is a third impurity region, is located in the P well 12. As viewed in plan view, the P-type impurity region 15 is located on top of the N-type impurity region 14 at a position outside the gate electrode 20 on the second end portion side, and is in contact with the N-type impurity region 14. In this way, by providing the P-type impurity region (pinning layer) 15 on top of the N-type impurity region 14 to which signal charges are transferred from the N-type impurity region 13 of the photodiode, it is possible to reduce dark current generated by residual charges in the N-type impurity region 14. The term "on" as used herein refers to, among directions vertical to the main surface (upper surface in FIG. 1B) of the N-type silicon substrate 11, a direction extending from the main surface toward the gate electrode 20.

However, when the P-type impurity region (pinning layer) 15 having a high concentration is provided on the N-type impurity region 14, a potential barrier may be formed in the transfer path for transferring signal charges from the photodiode, or the signal charges transferred to the N-type impurity region 14, which is a transfer destination, may flow backward, causing a problem of poor transfer.

To address this, according to the present embodiment, the N-type impurity region 14 is also provided in the P well 12 at a position under the gate electrode 20 on the second end portion side, it is thereby possible to suppress the generation of a potential barrier in the transfer path for transferring signal charges. Characteristics of the solid state imaging device vary according to a length (overlap amount) d by which the N-type impurity region 14 overlaps the gate electrode 20 as viewed in plan view.

Figure 2:
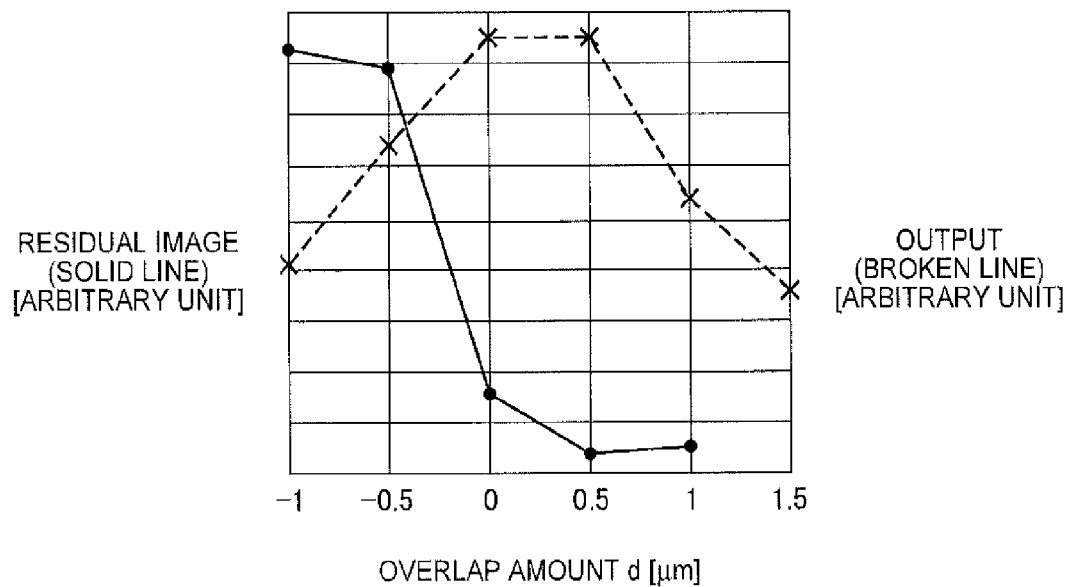
FIG. 2 is a diagram showing a relationship between an overlap amount and characteristics of the solid state imaging device.

FIG. 2 is a diagram showing a relationship between the overlap amount between the impurity region as a transfer destination and the transfer gate electrode, and the residual image and output of the solid state imaging device. In FIG. 2, the solid line indicates changes in residual image voltage (arbitrary unit) versus the overlap amount d (μm), and the broken line indicates changes in output voltage (arbitrary unit) versus the overlap amount d (μm). The characteristics shown in FIG. 2 are measured when the gate electrode 20 shown in FIGS. 1A and 1B has a gate length L of 3 μm.

As shown in FIG. 2, if the overlap amount d takes a negative value, the residual image voltage increases rapidly, and thus it can be seen that a large potential barrier is generated in the transfer path for transferring signal charges. If, on the other hand, the overlap amount d takes a positive value, the residual image voltage decreases, and thus it can be seen that the generation of a potential barrier in the transfer path for transferring signal charges is suppressed.

Also, if the overlap amount d takes a negative value, the transfer path for transferring signal charges is interrupted, and thus the output voltage decreases. This also is caused by a large potential barrier. If, on the other hand, the overlap amount d is excessively large, upon the transfer gate being turned off, the potential barrier decreases, and the signal charges stored in the N-type impurity region 13 of the photodiode leak out, and thus the output voltage decreases.

As described above, if the overlap amount d is greater than 0 μm, the residual image voltage decreases, but if the overlap amount d exceeds 1 μm, the output voltage decreases significantly. It is therefore desirable that the overlap amount d is within a range represented by 0 μm<d≤1 μm. Here, an overlap amount of 1 μm corresponds to ⅓ of a gate length of 3 μm. Accordingly, it is possible to suppress the generation of a potential barrier in the transfer path for transferring signal charges while not so much reducing the output voltage of the solid state imaging device, and to reduce the residual image voltage. If the overlap amount d exceeds 0.5 μm, the output voltage starts to decrease, and it is therefore further desirable that the overlap amount d is within a range represented by 0 μm<d≤0.5 μm. Here, an overlap amount of 0.5 μm corresponds to ⅙ of a gate length of 3 μm.

Manufacturing Method 1

A method of manufacturing the solid state imaging device shown in FIGS. 1A to 1C will be described next.

FIGS. 3A to 3F are diagrams illustrating the steps of a method of manufacturing the solid state imaging device shown in FIGS. 1A to 1C. As the semiconductor substrate used to manufacture the solid state imaging device, it is desirable to use an N-type semiconductor substrate having an impurity concentration of approximately $1 \times 10^{14}$ atoms/cm$^3$ or a P-type semiconductor substrate having an impurity concentration of approximately $1 \times 10^{14}$ atoms/cm$^3$ to approximately $1 \times 10^{15}$ atoms/cm$^3$. The following description will be given of, as an example, a case where an N-type silicon substrate 11 (see FIGS. 1A to 1C) having an impurity concentration of approximately $1 \times 10^{14}$ atoms/cm$^3$ is used.

Figure 3A:
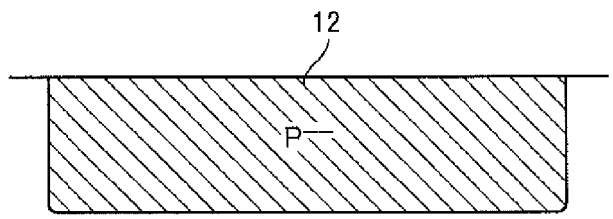
FIGS. 3A to 3F are diagrams illustrating the steps of a method of manufacturing the solid state imaging device shown in FIGS. 1A to 1C.

P-type impurity ions such as boron are implanted into the surface of the N-type silicon substrate 11, and the N-type silicon substrate 11 is then heat treated so as to thermally diffuse the impurity ions. A P well (P⁻) 12 is thereby formed in the N-type silicon substrate 11 as shown in FIG. 3A. The P well 12 may be formed by implanting P-type impurity ions in multiple stages (a plurality of times by changing the acceleration energy) or by implanting P-type impurity ions at high energy. It is desirable that the impurity concentration of the P well 12 is, for example, about $1\times10^{15}$ atoms/cm³. Furthermore, on the surface of the N-type silicon substrate 11, an oxide film (not shown), which will serve as an isolation region is formed by a LOCOS (local oxidation of silicon) method or the like, and a silicon oxide film (not shown), which will serve as a permeable membrane during ion implantation, is formed.

Figure 3B:
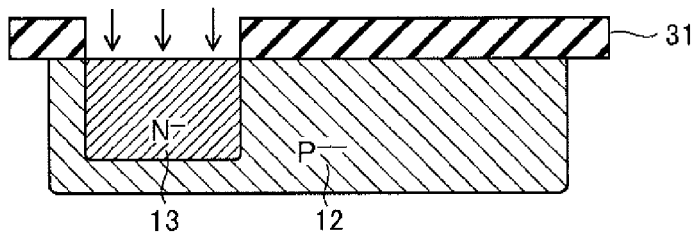

Next, as shown in FIG. 3B, a photoresist 31 is formed on the P well 12 by a photolithography technique. The photoresist 31 has an opening formed in a region that will serve as a photodiode. Furthermore, N-type impurity ions are implanted into the P well 12 by using the photoresist 31 as a mask, and an N-type impurity region (N⁻) 13 constituting the photodiode is formed in the P well 12.

It is desirable that the ion implantation is performed by implanting, for example, phosphorus ions in multiple stages at an acceleration energy of about 1.2 MeV to 150 keV so as to form an impurity profile in which the impurity concentration increases from bottom to top of the N-type impurity region 13. It is also desirable that the ion implantation is performed to achieve an impurity concentration of about $1\times10^{15}$ atoms/cm³ to $1\times10^{16}$ atoms/cm³ so that the N-type impurity region 13 constituting the photodiode is depleted by a depletion layer that will be later formed between the N-type impurity region 13 and the surrounding P-type impurity diffusion layer.

In the present embodiment, the P well 12 is formed in the N-type silicon substrate 11, and the N-type impurity region 13 is formed in the P well 12. However, it is also possible to form a P-type silicon layer on the N-type silicon substrate 11 by an epitaxial growth method and then form the N-type impurity region 13 in the P-type silicon layer.

Figure 3C:
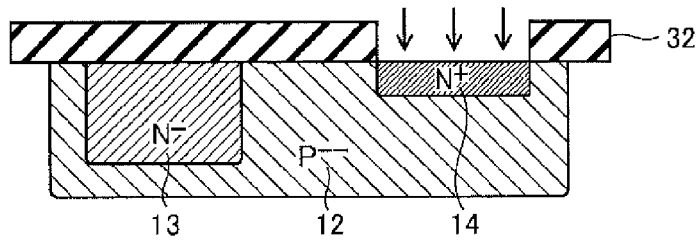

Next, as shown in FIG. 3C, the photoresist 31 is removed, and a photoresist 32 is formed on the N-type silicon substrate 11 by a photolithography technique. The photoresist 32 has an opening formed in a region that will be a charge transfer destination. Furthermore, N-type impurity ions are implanted into the P well 12 by using the photoresist 32 as a mask, and an NI-type impurity region (N⁺) 14 is thereby formed in the P well 12. The impurity concentration of the N-type impurity region 14 is adjusted to be higher than the impurity concentration of the N-type impurity region 13 constituting the photodiode.

The ion implantation is performed by using, for example, arsenic ions or phosphorus ions. In the case where phosphorus ions are used, it is desirable to set the implantation conditions as follows, for example: the acceleration energy is about 100 keV to 150 keV, the dose is about $1\times10^{12}$ atoms/cm² to $5\times10^{14}$ atoms/cm², and the implantation angle is about 7°.

Figure 3D:
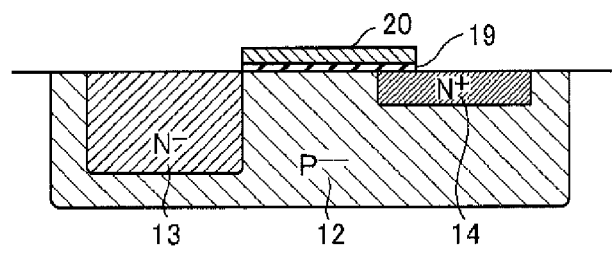

Next, as shown in FIG. 3D, the photoresist 32 is removed, and the silicon oxide film used as a permeable membrane is removed. After that, a gate insulation oxide film is formed, and polycrystalline silicon or the like is deposited and patterned. As a result, a gate electrode (transfer gate electrode) 20 is formed on the P well 12 via a gate insulation film 19. At this time, the position of the mask is adjusted such that the gate electrode 20 has an overlapping portion that overlaps the N-type impurity region 14 as viewed in plan view. The adjustment of the position of the mask may be performed when the N-type impurity region 14 is formed.

Figure 3E:
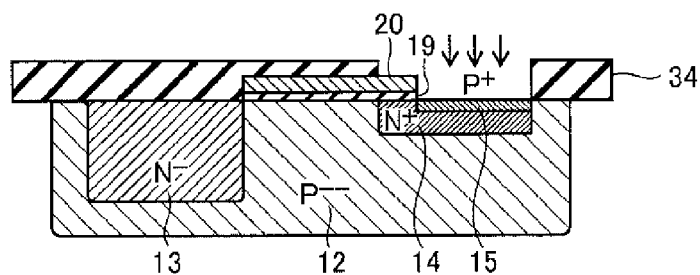

Next, as shown in FIG. 3E, a photoresist 34 is formed, by using a photolithography technique, on the N-type silicon substrate 11 where the gate electrode 20 and the like have been formed. Furthermore, P-type impurity ions are implanted into the P well 12 by using the gate electrode 20 and the photoresist 34 as a mask, and a P-type impurity region (pinning layer P⁺) 15 is thereby formed in the P well 12, the P-type impurity region 15 being located on top of the N-type impurity region 14 and being in contact with the N-type impurity region 14. At this time, a P-type impurity region (pinning layer) may be formed in the N-type impurity region 13 as well.

The ion implantation is performed by using, for example, boron ions. The impurity concentration of the P-type impurity region 15 is set to, for example, about $1\times10^{17}$ atoms/cm³ to $1\times10^{18}$ atoms/cm³. It is desirable that the implantation conditions are set as follows when, for example, BF²⁺ ions are used: the acceleration energy is about 40 keV, the dose is $5\times10^{12}$ atoms/cm² to $5\times10^{13}$ atoms/cm², and the implantation angle is about 7°.

Figure 3F:
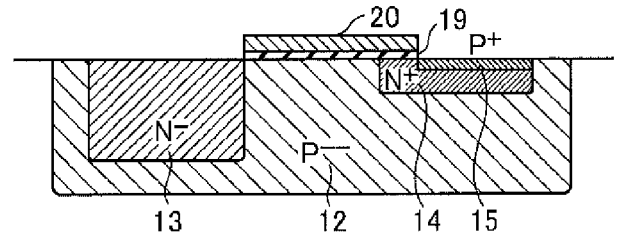

Next, as shown in FIG. 3F, the photoresist 34 is removed. After that, an interlayer insulation film is formed on the N-type silicon substrate 11 where the P-type impurity region 15 and the like have been formed, and a contact hole is formed in the interlayer insulation film. Furthermore, an interconnect layer made of aluminum (Al) or the like is formed on the interlayer insulation film so as to make an interconnection through the contact hole. In this way, a solid state imaging device is obtained. The interconnect layer may be configured as a multilayer if necessary. In addition, it is also possible to simultaneously form a circuit element such as a transistor of a next stage in the N-type silicon substrate 11.

The foregoing has described a case where the position of the mask is adjusted such that the gate electrode 20 has an overlapping portion that overlaps the N-type impurity region 14 as viewed in plan view. However, with the position of the mask used to form the N-type impurity region 14 and the gate electrode 20 being aligned, impurity ions may be implanted diagonally toward a position below a region where the gate electrode 20 is to be formed when the N-type impurity region 14 is formed. It is desirable that the implantation angle at this time is set to, for example, about 30° to 45° with respect to a direction vertical to the N-type silicon substrate 11.

Second Embodiment

Figure 4A:
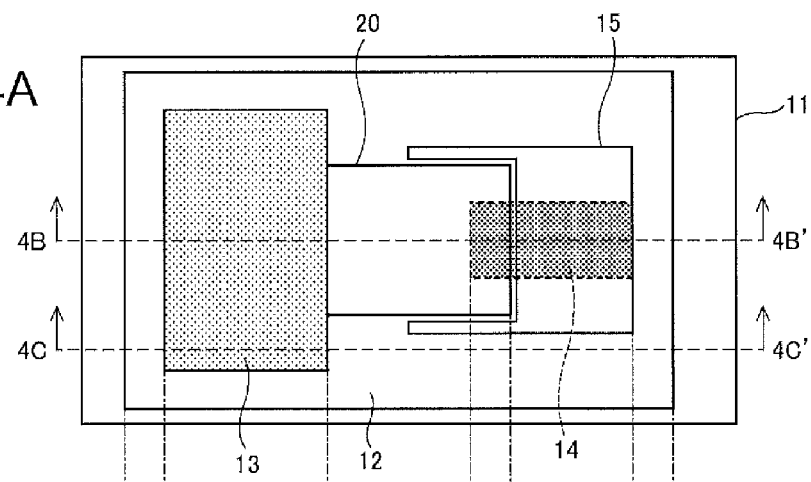
FIGS. 4A to 4C are diagrams showing a solid state imaging device according to a second embodiment of the invention.
Figure 4B:
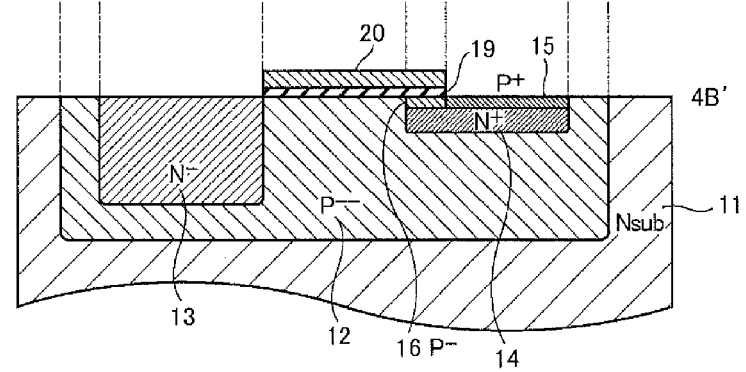
Figure 4C:
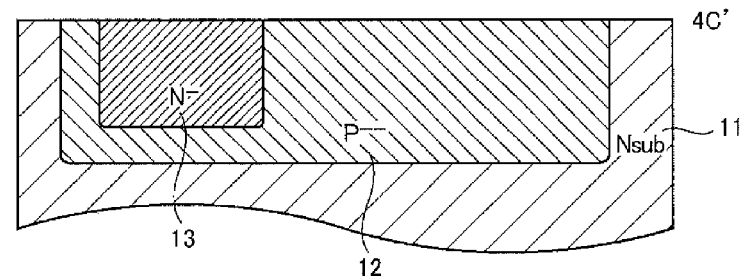

FIGS. 4A to 4C are diagrams showing a solid state imaging device according to a second embodiment of the invention. FIG. 4A is a plan view, FIG. 4B is a cross-sectional view taken along the line 4B-4B' shown in FIG. 4A, and FIG. 4C is a cross-sectional view taken along the line 4C-4C' shown in FIG. 4A.

The solid state imaging device according to the second embodiment further includes, as a fourth impurity region, a P-type impurity region (P⁻) 16 provided in the P well 12. The P-type impurity region 16 is located in the P well 12 at a position between the N-type impurity region 14 and the gate insulation film 19, and is in contact with the N-type impurity region 14 and the gate insulation film 19. Also, the P-type impurity region 16 has an impurity concentration lower than that of the P-type impurity region (pinning layer P$^+$) 15. Other than the above, the second embodiment is the same as the first embodiment.

Manufacturing Method 2

A method of manufacturing the solid state imaging device shown in FIGS. 4A to 4C will be described next.

FIGS. 5A to 5G are diagrams illustrating the steps of a method of manufacturing the solid state imaging device shown in FIGS. 4A to 4C. FIGS. 5A to 5C are the same as FIGS. 3A to 3C, and thus a description thereof is omitted here.

As shown in FIG. 5D, P-type impurity ions are implanted into the N-type impurity region 14 by using, as a mask, the photoresist 32 used when the N-type impurity region 14 was formed, and a P-type impurity region (P$^-$) 16 in contact with the N-type impurity region 14 is thereby formed in the P well 12. The P-type impurity region 16 has an impurity concentration lower than that of the P-type impurity region (pinning layer P$^+$) 15.

The ion implantation is performed by using, for example, boron ions. It is desirable that the implantation conditions when boron ions are used are set as follows, for example: the acceleration energy is about 20 keV, the dose is about $1 \times 10^{12}$ atoms/cm$^2$ to $1 \times 10^{13}$ atoms/cm$^2$, and the implantation angle is about 7°.

Next, as shown in FIG. 5E, the photoresist 32 is removed, and the silicon oxide film used as a permeable membrane is removed. After that, a gate insulation oxide film is formed, and polycrystalline silicon or the like is deposited and patterned. As a result, a gate electrode (transfer gate electrode) 20 is formed on the P well 12 via a gate insulation film 19. At this time, the position of the mask is adjusted such that the gate electrode 20 has an overlapping portion that overlaps the N-type impurity region 14 and the P-type impurity region 16 as viewed in plan view. The adjustment of the position of the mask may be performed when the N-type impurity region 14 and the P-type impurity region 16 are formed.

Next, as shown in FIG. 5F, a photoresist 34 is formed, by using a photolithography technique, on the N-type silicon substrate 11 (see FIGS. 4A to 4C) where the gate electrode 20 and the like have been formed. Furthermore, P-type impurity ions are implanted into the P well 12 by using the gate electrode 20 and the photoresist 34 as a mask, and a P-type impurity region (pinning layer P$^+$) 15 is thereby formed in the P well 12, the P-type impurity region 15 being located on top of the N-type impurity region 14 and being in contact with the N-type impurity region 14. At this time, a P-type impurity region (pinning layer) may be formed in the N-type impurity region 13 as well.

Next, as shown in FIG. 5G, the photoresist 34 is removed. The steps performed after this are the same as those described in connection with the first embodiment. The foregoing has described a case where the position of the mask is adjusted such that the gate electrode 20 has an overlapping portion that overlaps the N-type impurity region 14 and the P-type impurity region 16 as viewed in plan view.

However, with the position of the mask used to form the N-type impurity region 14, the P-type impurity region 16 and the gate electrode 20 being aligned, impurity ions may be implanted diagonally toward a position below a region where the gate electrode 20 is to be formed when the N-type impurity region 14 is formed. It is desirable that the implantation angle at this time is set to, for example, about 30° to 45° with respect to a direction vertical to the N-type silicon substrate 11.

Also, impurity ions may be implanted diagonally toward a position below the region where the gate electrode 20 is to be formed when the P-type impurity region 16 is formed. It is desirable that the implantation angle at this time is set to, for example, about 30° to 45° with respect to a direction vertical to the N-type silicon substrate 11, but the implantation angle may be set to about 7° so as to not generate a potential barrier.

Third Embodiment

Figure 6A:
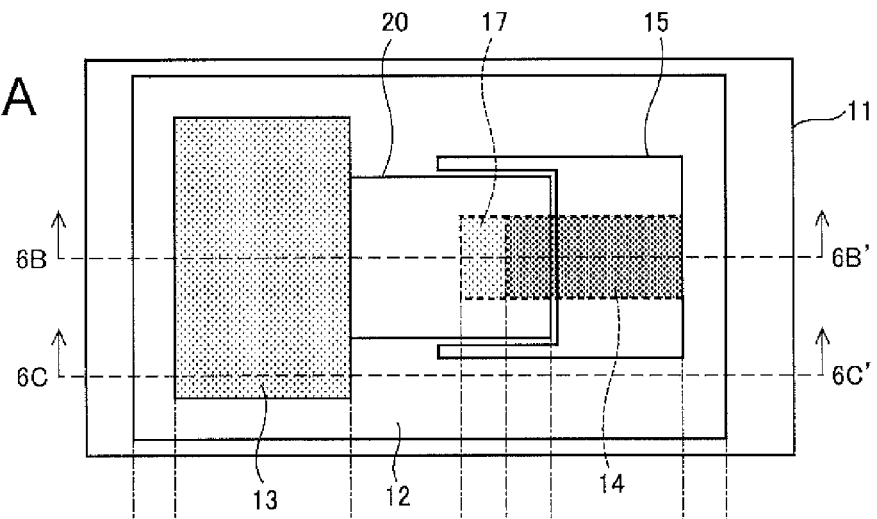
FIGS. 6A to 6C are diagrams showing a solid state imaging device according to a third embodiment of the invention.
Figure 6B:
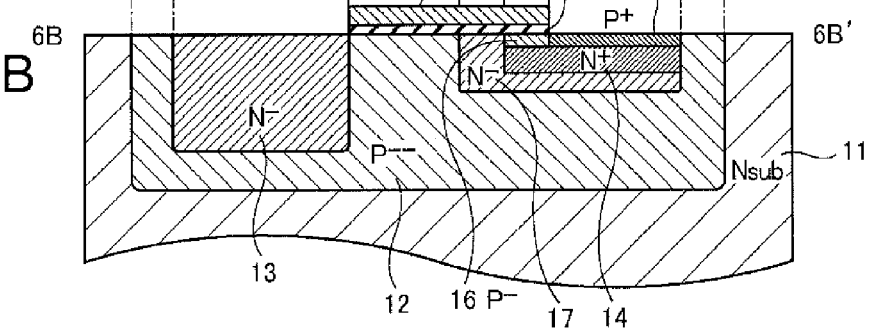
Figure 6C:
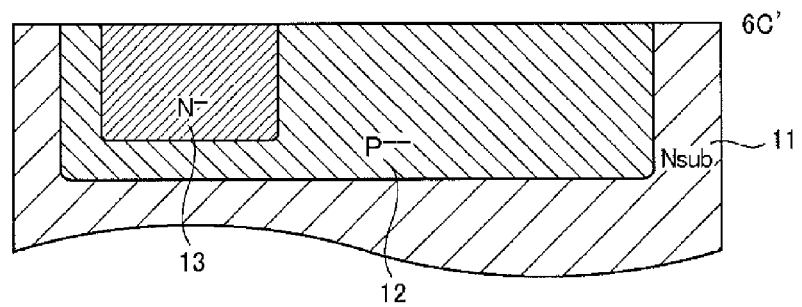

FIGS. 6A to 6C are diagrams showing a solid state imaging device according to a third embodiment of the invention. FIG. 6A is a plan view, FIG. 6B is a cross-sectional view taken along the line 6B-6B' shown in FIG. 6A, and FIG. 6C is a cross-sectional view taken along the line 6C-6C' shown in FIG. 6A.

The solid state imaging device according to the third embodiment further includes, as a fifth impurity region, an N-type impurity region (N$^-$) 17 provided in the P well 12, in addition to the P-type impurity region (P$^-$) 16. The N-type impurity region 17 is located in the P well 12, extends from a portion under the gate insulation film 19 to a portion under the N-type impurity region 14, and is in contact with the gate insulation film 19 and the N-type impurity region 14. Also, the N-type impurity region 17 has an impurity concentration lower than that of the N-type impurity region (N$^+$) 14. Other than the above, the third embodiment is the same as the second embodiment.

Manufacturing Method 3

A method of manufacturing the solid state imaging device shown in FIGS. 6A to 6C will be described next.

FIGS. 7A to 7H are diagrams illustrating the steps of a method of manufacturing the solid state imaging device shown in FIGS. 6A to 6C. FIGS. 7A to 7D are the same as FIGS. 5A to 5D, and thus a description thereof is omitted here.

Figure 7A:
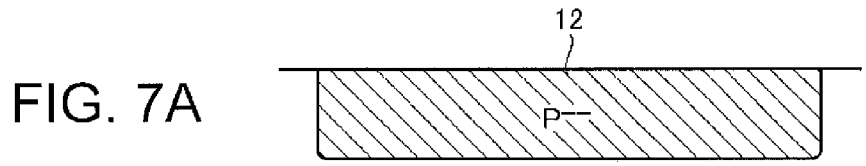
FIGS. 7A to 7H are diagrams illustrating the steps of a method of manufacturing the solid state imaging device shown in FIGS. 6A to 6C.
Figure 7B:
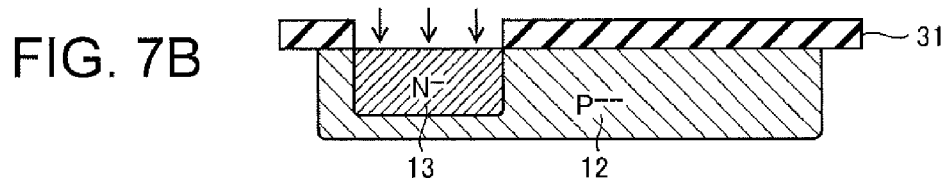
Figure 7C:
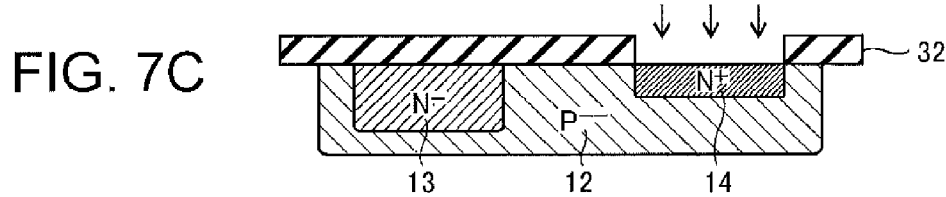
Figure 7D:
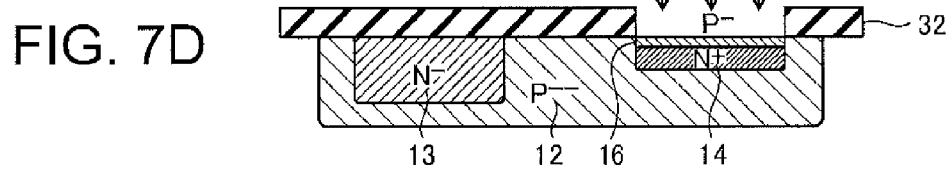
Figure 7E:
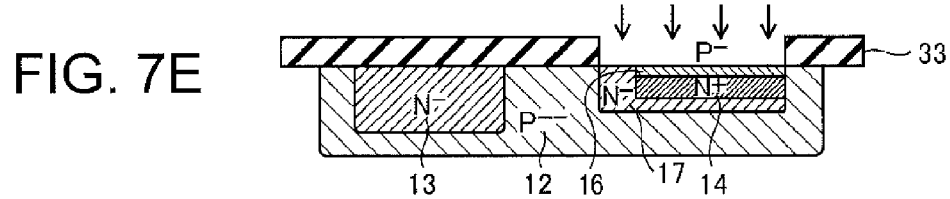

As shown in FIG. 7E, the photoresist 32 is removed, and a photoresist 33 is formed on the N-type silicon substrate 11 (see FIGS. 6A to 6C) by a photolithography technique. The photoresist 33 has an opening expanded from that of the photoresist 32 in a direction of the N-type impurity region 13 (the left direction in the diagram). Furthermore, N-type impurity ions are implanted into the P well 12 by using the photoresist 33 as a mask, and an N-type impurity region (N$^-$) 17 is thereby formed in the P well 12, the N-type impurity region (N$^-$) 17 extending from the surface of the P well 12 to a portion under the N-type impurity region 14 and being in contact with the N-type impurity region 14.

The N-type impurity region 17 has an impurity concentration lower than that of the N-type impurity region (N$^+$) 14, and the ion implantation is adjusted such that the implantation depth of impurity ions into the N-type impurity region 17 is greater than the implantation depth of impurity ions into the N-type impurity region 14. The ion implantation is performed by using, for example, phosphorus ions. It is desirable that the implantation conditions when phosphorus ions are used are set as follows, for example: the acceleration energy is about 200 keV to 350 keV, the dose is about $5 \times 10^{11}$ atoms/cm$^2$ to $1 \times 10^{13}$ atoms/cm$^2$, and the implantation angle is about 7°.

Figure 7F:
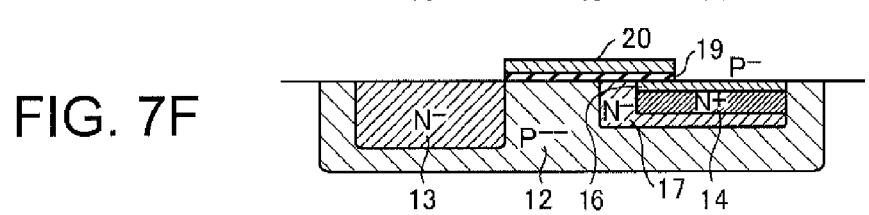

Next, as shown in FIG. 7F, the photoresist 33 is removed, and the silicon oxide film used as a permeable membrane is removed. After that, a gate insulation oxide film is formed, and polycrystalline silicon or the like is deposited and patterned. As a result, a gate electrode (transfer gate electrode) 20 is formed on the P well 12 via a gate insulation film 19. At this time, the position of the mask is adjusted such that the gate electrode 20 has an overlapping portion that overlaps the N-type impurity region 17, the N-type impurity region 14 and the P-type impurity region 16 as viewed in plan view.

Figure 7G:
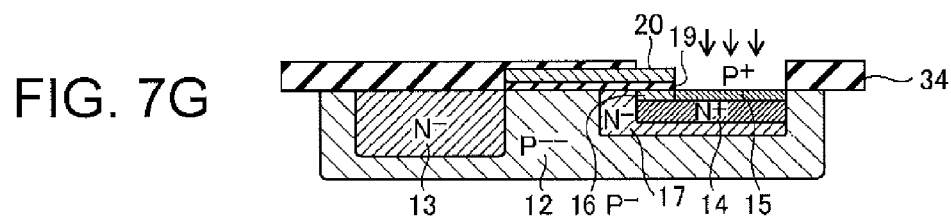

Next, as shown in FIG. 7G, a photoresist 34 is formed, by using a photolithography technique, on the N-type silicon substrate 11 where the gate electrode 20 and the like have been formed. Furthermore, P-type impurity ions are implanted into the P well 12 by using the gate electrode 20 and the photoresist 34 as a mask, and a P-type impurity region (pinning layer P$^+$) 15 is thereby formed in the P well 12, the P-type impurity region 15 being located on top of the N-type impurity region 14 and being in contact with the N-type impurity region 14. At this time, a P-type impurity region (pinning layer) may be formed in the N-type impurity region 13 as well.

Figure 7H:
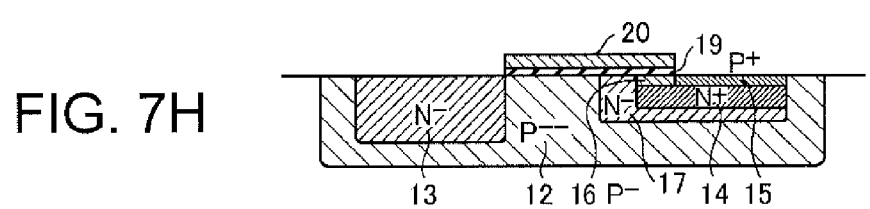

Next, as shown in FIG. 7H, the photoresist 34 is removed. The steps performed after this are the same as those described in connection with the first embodiment.

Variation of Third Embodiment

Figure 8A:
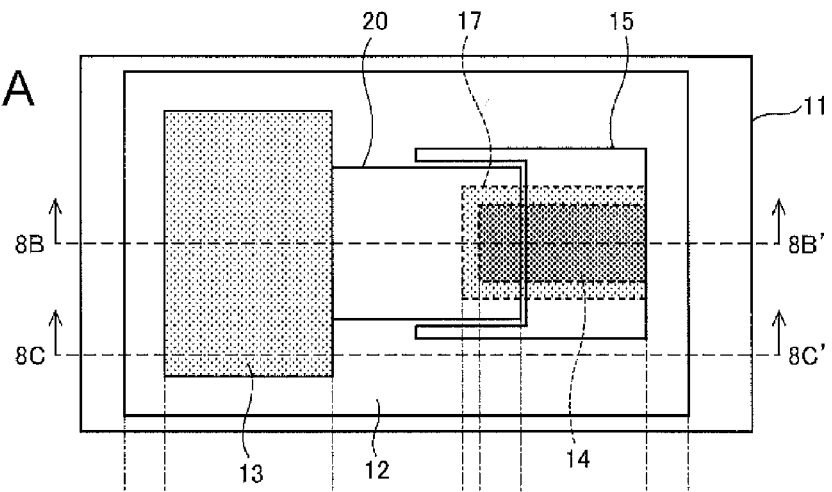
FIGS. 8A to 8C are diagrams showing a solid state imaging device according to a variation of the third embodiment of the invention.
Figure 8B:
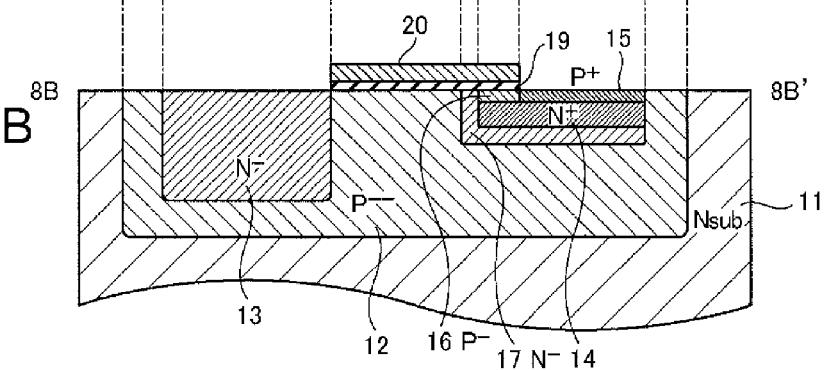
Figure 8C:
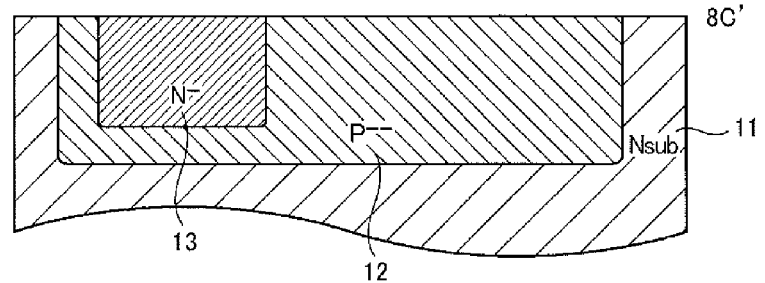

FIGS. 8A to 8C are diagrams showing a solid state imaging device according to a variation of the third embodiment of the invention. FIG. 8A is a plan view, FIG. 8B is a cross-sectional view taken along the line 8B-8B' shown in FIG. 8A, and FIG. 8C is a cross-sectional view taken along the line 8C-8C' shown in FIG. 8A.

As shown in FIGS. 8A and 8B, in the variation of the third embodiment, the N-type impurity region (N$^-$) 17 extends from a portion under the N-type impurity region 14 to, as viewed in plan view, a region outside a front end portion of the N-type impurity region 14 (the end portion on the N-type impurity region 13 side substantially parallel to the gate width direction), and also extends in, as viewed in plan view, regions outside two side end portions of the N-type impurity region 14 (the end portions substantially parallel to the gate length direction).

With this configuration, the N-type impurity region 17 can control not only a flow of carriers from the front but also a flow of carriers from the sides, and thus further contribute to the reduction of residual charges and the like. From the viewpoint of forming the same structure in the front direction and the side direction, it is desirable that the amount of protrusion in the side direction of the N-type impurity region 17 from the N-type impurity region 14 is substantially equal to the amount of protrusion in the front direction of the N-type impurity region 17 from the N-type impurity region 14. Other than the above, the variation of the third embodiment is the same as the third embodiment.

Fourth Embodiment

Figure 9A:
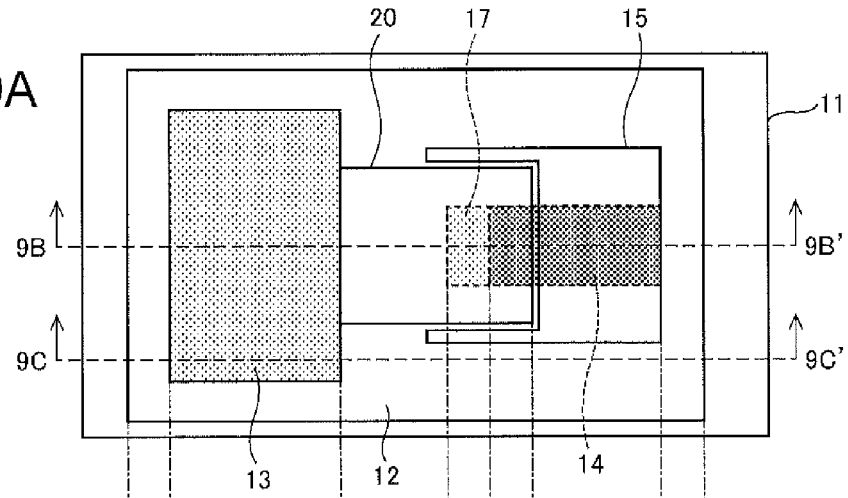
FIGS. 9A to 9C are diagrams showing a solid state imaging device according to a fourth embodiment of the invention.
Figure 9B:
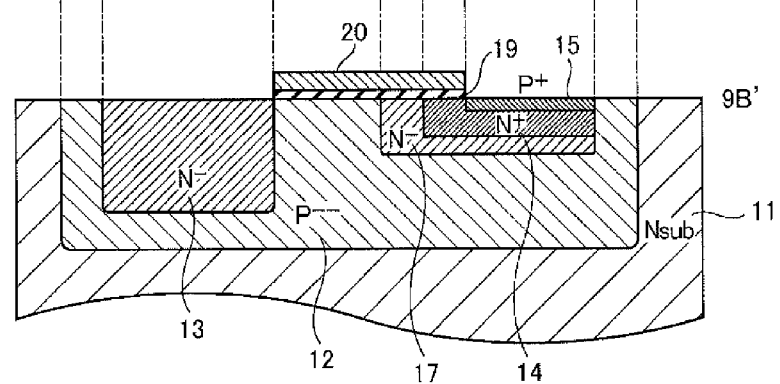
Figure 9C:
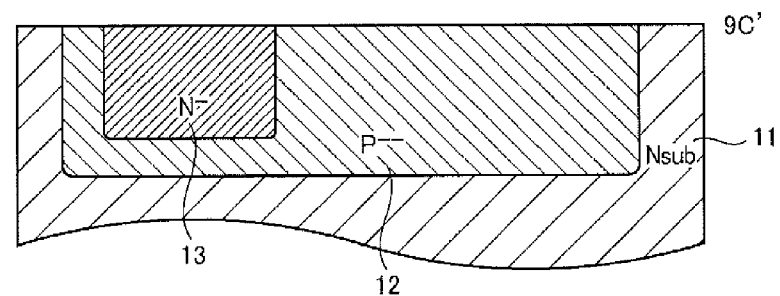

FIGS. 9A to 9C are diagrams showing a solid state imaging device according to a fourth embodiment of the invention. FIG. 9A is a plan view, FIG. 9B is a cross-sectional view taken along the line 9B-9B' shown in FIG. 9A, and FIG. 9C is a cross-sectional view taken along the line 9C-9C' shown in FIG. 9A.

In the solid state imaging device according to the fourth embodiment, the P-type impurity region (P$^-$) 16 according to the third embodiment shown in FIG. 6B is omitted. Other than the above, the fourth embodiment is the same as the third embodiment.

Manufacturing Method 4

A method of manufacturing the solid state imaging device shown in FIGS. 9A to 9C will be described next.

Figure 10A:
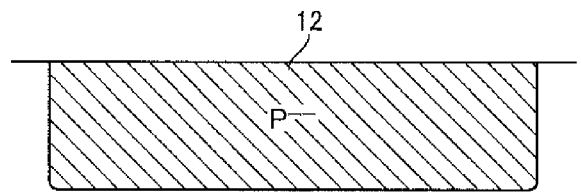
FIGS. 10A to 10G are diagrams illustrating the steps of a method of manufacturing the solid state imaging device shown in FIGS. 9A to 9C.
Figure 10B:
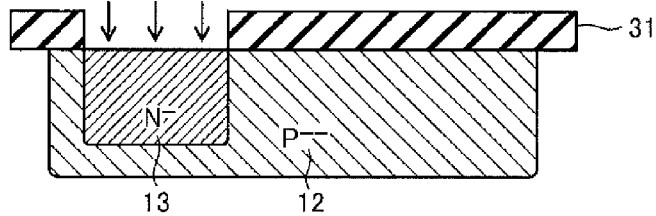
Figure 10C:
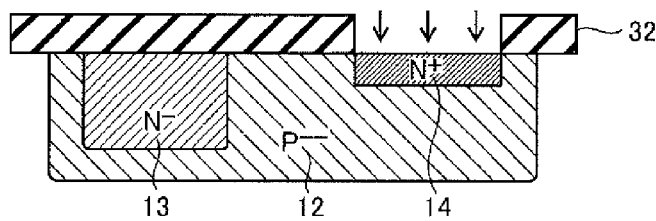

FIGS. 10A to 10G are diagrams illustrating the steps of a method of manufacturing the solid state imaging device shown in FIGS. 9A to 9C. FIGS. 10A to 10C are the same as FIGS. 7A to 7C, and thus a description thereof is omitted here.

Figure 10D:
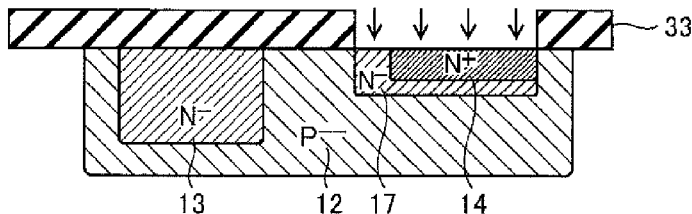

As shown in FIG. 10D, the photoresist 32 is removed, and a photoresist 33 is formed on the N-type silicon substrate 11 (see FIGS. 9A to 9C) by using a photolithography technique. The photoresist 33 has an opening expanded from that of the photoresist 32 in a direction of the N-type impurity region 13 (the left direction in the diagram). Furthermore, N-type impurity ions are implanted into the P well 12 by using the photoresist 33 as a mask, and an N-type impurity region (N$^-$) 17 is thereby formed in the P well 12, the N-type impurity region (N$^-$) 17 extending from the surface of the P well 12 to a portion under the N-type impurity region 14 and being in contact with the N-type impurity region 14.

Figure 10E:
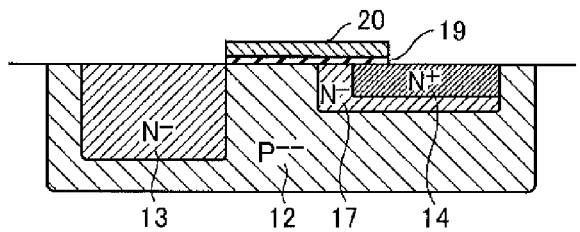

Next, as shown in FIG. 10E, the photoresist 33 is removed, and the silicon oxide film used as a permeable membrane is removed. After that, a gate insulation oxide film is formed, and polycrystalline silicon or the like is deposited and patterned. As a result, a gate electrode (transfer gate electrode) 20 is formed on the P well 12 via a gate insulation film 19. At this time, the position of the mask is adjusted such that the gate electrode 20 has an overlapping portion that overlaps the N-type impurity region 17 and the N-type impurity region 14 as viewed in plan view.

Figure 10F:
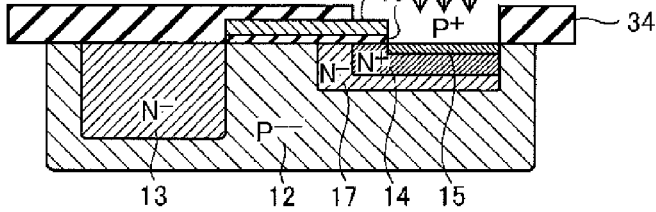

Next, as shown in FIG. 10F, a photoresist 34 is formed, by using a photolithography technique, on the N-type silicon substrate 11 where the gate electrode 20 and the like have been formed. Furthermore, P-type impurity ions are implanted into the P well 12 by using the gate electrode 20 and the photoresist 34 as a mask, and a P-type impurity region (pinning layer P$^+$) 15 is thereby formed in the P well 12, the P-type impurity region 15 being located on top of the N-type impurity region 14 and being in contact with the N-type impurity region 14. At this time, a P-type impurity region (pinning layer) may be formed in the N-type impurity region 13 as well.

Figure 10G:
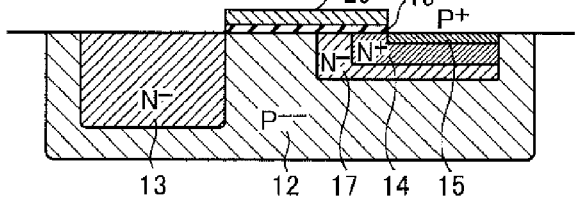

Next, as shown in FIG. 10G, the photoresist 34 is removed. The steps performed after this are the same as those described in connection with the first embodiment.

Variation of Fourth Embodiment

Figure 11A:
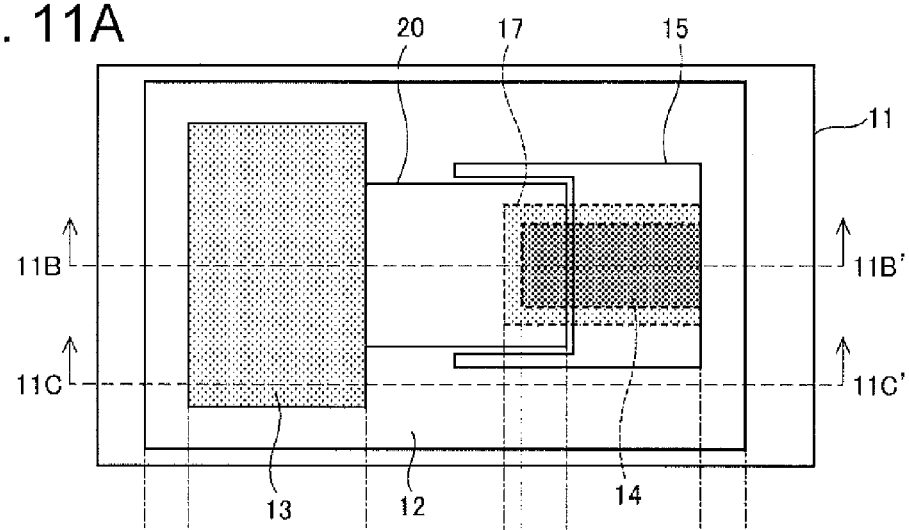
FIGS. 11A to 11C are diagrams showing a solid state imaging device according to a variation of the fourth embodiment of the invention.
Figure 11B:
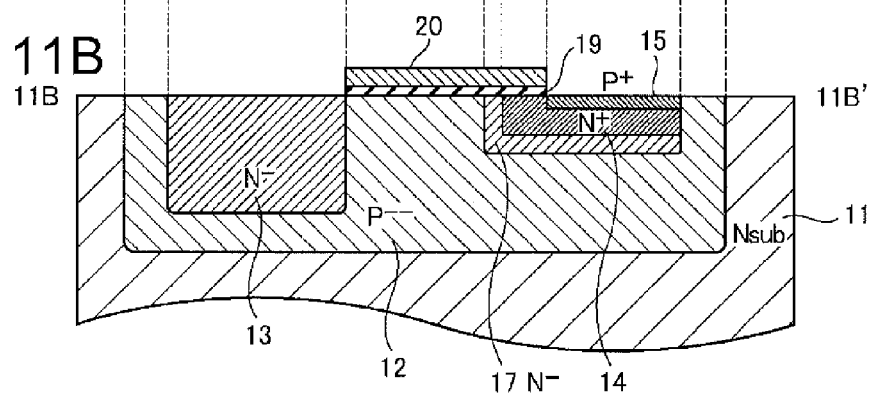
Figure 11C:
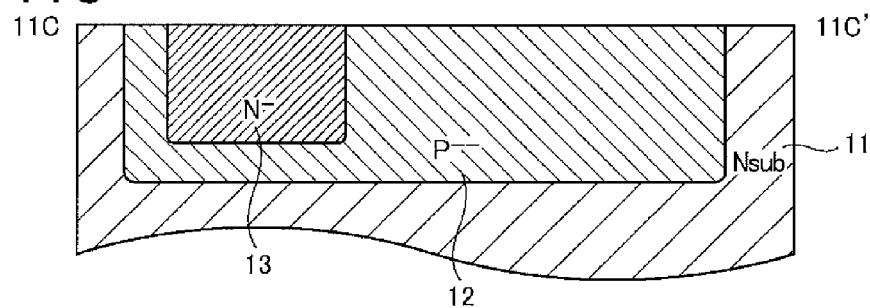

FIGS. 11A to 11C are diagrams showing a solid state imaging device according to a variation of the fourth embodiment of the invention. FIG. 11A is a plan view, FIG. 11B is a cross-sectional view taken along the line 11B-11B' shown in FIG. 11A, and FIG. 11C is a cross-sectional view taken along the line 11C-11C' shown in FIG. 11A.

As shown in FIGS. 11A and 11B, in the variation of the fourth embodiment, the N-type impurity region (N$^-$) 17 extends from a portion under the N-type impurity region 14 to, as viewed in plan view, a region outside a front end portion of the N-type impurity region 14 (the end portion on the N-type impurity region 13 side substantially parallel to the gate width direction), and also extends in, as viewed in plan view, regions outside two side end portions of the N-type impurity region 14 (the end portions substantially parallel to the gate length direction).

With this configuration, the N-type impurity region 17 can control not only a flow of carriers from the front but also a flow of carriers from the sides, and thus further contribute to the reduction of residual charges and the like. From the viewpoint of forming the same structure in the front direction and the side direction, it is desirable that the amount of protrusion in the side direction of the N-type impurity region 17 from the N-type impurity region 14 is substantially equal to the amount of protrusion in the front direction of the N-type impurity region 17 from the N-type impurity region 14. Other than the above, the variation of the fourth embodiment is the same as the fourth embodiment.

Next, the state of potential in the transfer path for transferring signal charges in the solid state imaging devices according to the first to fourth embodiments of the invention will be described in comparison with that of a conventional example.

Figure 12A:
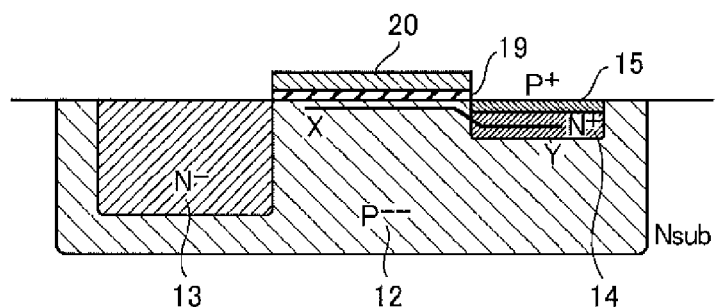
FIGS. 12A and 12B are diagrams showing a solid state imaging device of a conventional example and the state of potential thereof.
Figure 12B:
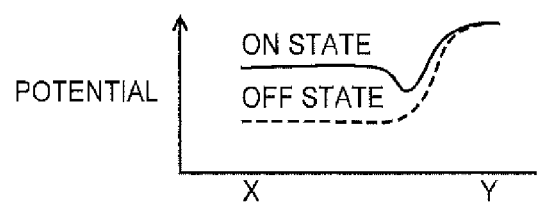

FIGS. 12A and 12B are diagrams schematically showing a solid state imaging device of a conventional example and the state of potential thereof. FIGS. 13A to 16B are diagrams schematically showing the solid state imaging devices according to the first to fourth embodiments of the invention and their potential thereof.

FIGS. 12A, 13A, 14A, 15A and 16A are cross-sectional views of the solid state imaging devices. FIGS. 12B, 13B, 14B, 15B and 16B show the state of potential when the transfer gate is turned on (indicated by a solid line) and the state of potential when the transfer gate is turned off (indicated by a broken line) at a position along the line X-Y shown in FIGS. 12A, 13A, 14A, 15A and 16A.

As shown in FIG. 12A, in the conventional example, the N-type impurity region 14 and the P-type impurity region 15 are located in the P well 12 at a position outside the second end portion (the end portion on the right side of the diagram) of the gate electrode 20. In this case, as shown in FIG. 12B, a potential barrier is generated at the outlet of the transfer gate, and the charges left untransferred cause a residual image phenomenon.

Figure 13A:
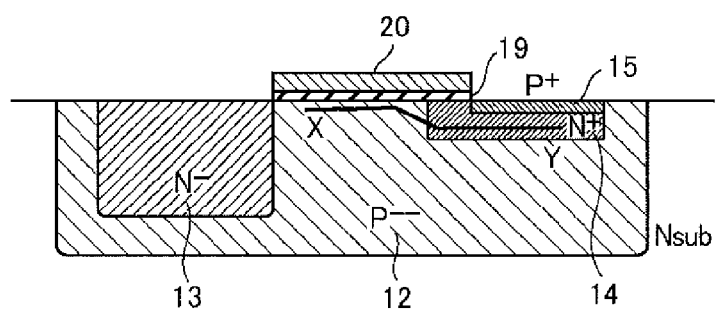
FIGS. 13A and 13B are diagrams showing the solid state imaging device according to the first embodiment and the state of potential thereof.
Figure 13B:
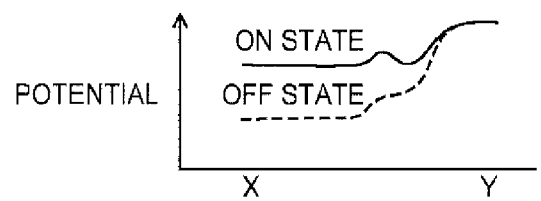

As shown in FIG. 13A, in the first embodiment of the invention, the N-type impurity region 14 is also located at a position inside the second end portion (the end portion on the right side of the diagram) of the gate electrode 20 in the P well 12. In this case, as shown in FIG. 13B, the potential barrier at the outlet of the transfer gate can be lowered, and thus transfer with less residual charges can be implemented.

Figure 14A:
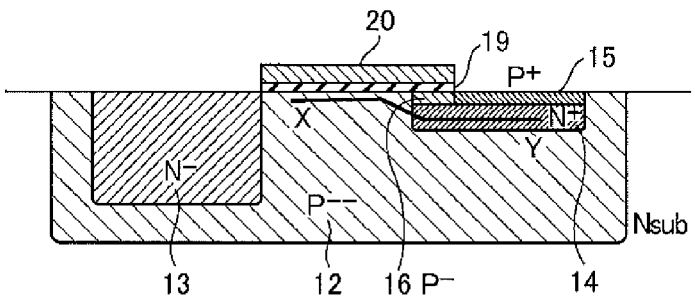
FIGS. 14A and 14B are diagrams showing the solid state imaging device according to the second embodiment and the state of potential thereof.

As shown in FIG. 14A, in the second embodiment of the invention, the P-type impurity region (P⁻) 16 located between the N-type impurity region 14 and the gate insulation film 19 has been added. The P-type impurity region 16 has an impurity concentration lower than that of the P-type impurity region (pinning layer P⁺) 15.

Figure 14B:
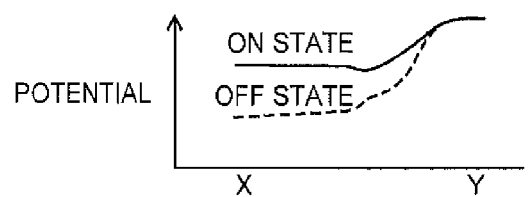

In this case, the P-type impurity region 16 functions to suppress the generation of a potential well, and thus, as shown in FIG. 14B, the size and impurity concentration of each constituent element can be adjusted so as to not generate a potential barrier or well in the transfer path for transferring signal charges.

Figure 15A:
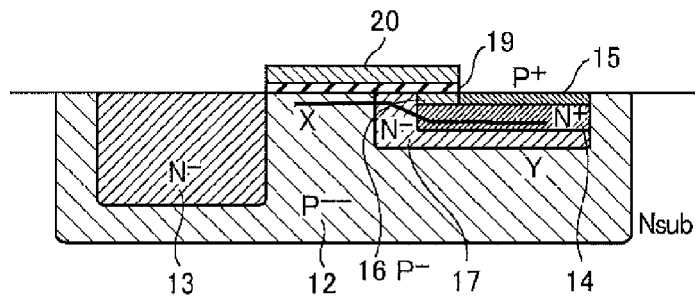
FIGS. 15A and 15B are diagrams showing the solid state imaging device according to the third embodiment and the state of potential thereof.

As shown in FIG. 15A, in the third embodiment of the invention, in addition to the P-type impurity region (P⁻) 16, the N-type impurity region (N⁻) 17 that extends from a portion under the gate insulation film 19 to a portion under the N-type impurity region 14 and is in contact with the gate insulation film 19 and the N-type impurity region 14 has been added. The N-type impurity region 17 has an impurity concentration lower than that of the N-type impurity region (N⁺) 14.

Figure 15B:
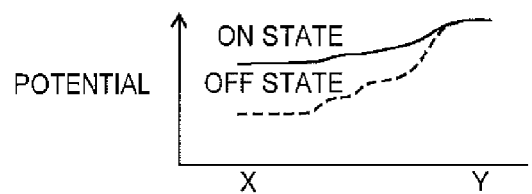

In this case, as shown in FIG. 15B, almost no potential barrier or well is generated, and thus a transfer path for transferring signal charges having a smooth profile is implemented. Also, because the N-type impurity region 17 has been added, in the transfer path for transferring signal charges, the distance from the N-type impurity region 13 to an initial potential step is shortened. Accordingly, when the transfer gate is turned off, the potential step functions to block the charges, and thus an effect of preventing the backflow of signal charges transferred to the N-type impurity region 14 can be obtained.

Figure 16A:
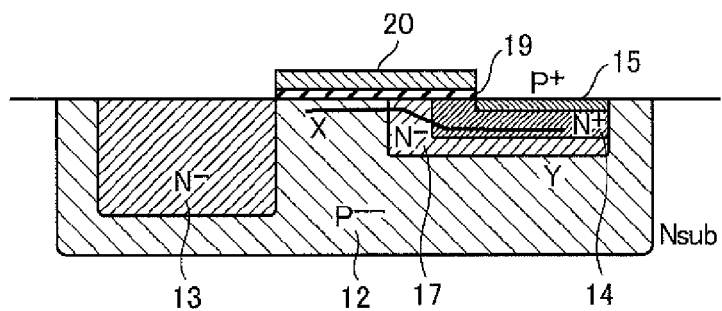
FIGS. 16A and 16B are diagrams showing the solid state imaging device according to the fourth embodiment and the state of potential thereof.

As shown in FIG. 16A, in the fourth embodiment of the invention, although the P-type impurity region (P⁻) 16 shown in FIG. 15A is omitted, the N-type impurity region (N⁻) 17 that extends from a portion under the gate insulation film 19 to a portion under the N-type impurity region 14 and is in contact with the gate insulation film 19 and the N-type impurity region 14 is provided. The N-type impurity region 17 has an impurity concentration lower than that of the N-type impurity region (N⁺) 14.

Figure 16B:
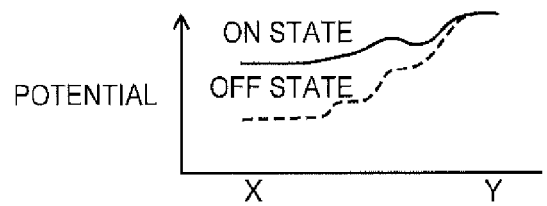

In this case, as shown in FIG. 16B, a potential well at a boundary portion between the N-type impurity region (N⁻) 17 and the N-type impurity region (N⁺) 14 is smaller than the potential barrier of the conventional example. Also, as in the third embodiment, when the transfer gate is turned off, the potential step functions to block the charges, and thus an effect of preventing the backflow of transferred signal charges can be obtained.

The embodiments given above have been described taking a case where an N-type impurity region and the like are formed in a P-type semiconductor layer, but the invention is not limited to the embodiments described above. The invention is also applicable to, for example, a case where a P-type impurity region and the like are formed in an N-type semiconductor layer. Accordingly, various modifications can be made by a person having ordinary skill in the art within the technical scope of the invention.

The entire disclosure of Japanese Patent Application No. 2015-145271, filed Jul. 22, 2015 is expressly incorporated by reference herein.

What is claimed is:

1. A solid state imaging device comprising:
   a semiconductor layer of a first conductivity type;
   a gate insulation film that is located on the semiconductor layer;
   a gate electrode that is located on the gate insulation film;
   a first impurity region of a second conductivity type that is located in the semiconductor layer and is located, as viewed in plan view, at least in a region outside the gate electrode on a first end portion side, the first impurity region constituting a photodiode;
   a second impurity region of the second conductivity type that is located in the semiconductor layer and is located, as viewed in plan view, in a region extending across a second end portion that is opposite to the first end portion of the gate electrode, the second impurity region storing charges transferred from the photodiode; and
   a third impurity region of the first conductivity type that is located in the semiconductor layer, is located on top of the second impurity region at a position outside the gate electrode on the second end portion side as viewed in plan view, and is in contact with the second impurity region.

2. The solid state imaging device according to claim 1, further comprising:
   a fourth impurity region of the first conductivity type that is located in the semiconductor layer, is located at a position between the second impurity region and the gate insulation film, is in contact with the second impurity region and the gate insulation film, and has an impurity concentration lower than an impurity concentration of the third impurity region.

3. The solid state imaging device according to claim 1, further comprising:
  a fifth impurity region of the second conductivity type that is located in the semiconductor layer, extends from a portion under the gate insulation film to a portion under the second impurity region, is in contact with the gate insulation film and the second impurity region, and has an impurity concentration lower than an impurity concentration of the second impurity region.

4. The solid state imaging device according to claim 1, wherein
  the second impurity region has an overlapping length that overlaps the gate electrode as viewed in plan view of greater than 0 and less than or equal to $1/3$ of a length of the gate electrode.

5. A method of manufacturing a solid state imaging device comprising:
  (a) implanting impurity ions of a second conductivity type into a semiconductor layer of a first conductivity type by using a first photoresist as a mask so as to form a first impurity region of the second conductivity type in the semiconductor layer;
  (b) implanting impurity ions of the second conductivity type into the semiconductor layer by using a second photoresist as a mask so as to form a second impurity region of the second conductivity type in the semiconductor layer;
  (c) forming a gate electrode on the semiconductor layer via a gate insulation film, the gate electrode having an overlapping portion that overlaps the second impurity region as viewed in plan view; and
  (d) implanting impurity ions of the first conductivity type into the semiconductor layer by using the gate electrode and a third photoresist as a mask so as to form a third impurity region of the first conductivity type in the semiconductor layer, the third impurity region being located on top of the second impurity region and being in contact with the second impurity region.

6. The method of manufacturing a solid state imaging device according to claim 5, further comprising:
  (e) prior to the step (c), implanting impurity ions of the first conductivity type into the second impurity region by using the second photoresist as a mask so as to form, in the semiconductor layer, a fourth impurity region of the first conductivity type that is in contact with the second impurity region and has an impurity concentration lower than an impurity concentration of the third impurity region.

7. The method of manufacturing a solid state imaging device according to claim 5, further comprising:
  (f) prior to the step (c), implanting impurity ions of the second conductivity type into the semiconductor layer by using a fourth photoresist as a mask so as to form, in the semiconductor layer, a fifth impurity region of the second conductivity type that extends from a surface of the semiconductor layer to a portion under the second impurity region, is in contact with the second impurity region, and has an impurity concentration lower than an impurity concentration of the second impurity region.

8. The solid state imaging device according to claim 1, wherein
  an impurity concentration of the second impurity region is higher than an impurity concentration of the first impurity region constituting the photodiode.

* * * * *